(12) United States Patent
Chen et al.

(10) Patent No.: US 9,263,839 B2
(45) Date of Patent: Feb. 16, 2016

(54) SYSTEM AND METHOD FOR AN IMPROVED FINE PITCH JOINT

(71) Applicant: Taiwan Semiconductor Manufacturing Company, Ltd., Hsin-Chu (TW)

(72) Inventors: Cheng-Ting Chen, Taichung (TW); Wen-Hsiung Lu, Jhonghe (TW); Ming-Da Cheng, Jhubei (TW); Chung-Shi Liu, Hsin-Chu (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 13/751,289

(22) Filed: Jan. 28, 2013

(65) Prior Publication Data

US 2014/0187103 A1 Jul. 3, 2014

Related U.S. Application Data

(60) Provisional application No. 61/746,687, filed on Dec. 28, 2012.

(51) Int. Cl.
*H01R 12/00* (2006.01)
*H01R 43/02* (2006.01)
(Continued)

(52) U.S. Cl.
CPC ............ *H01R 43/0235* (2013.01); *H01L 24/11* (2013.01); *H01L 24/13* (2013.01);
(Continued)

(58) Field of Classification Search
CPC ....... H01L 24/13; H01L 21/566; H01L 24/03; H01L 24/05; H01L 24/11; H01L 2224/16225; H01L 2924/181; H01L 2224/0401; H01L 2224/13144; H01L 2224/131; H01L 2924/18161; H01L 2224/81024; H01L 2224/11334; H01L 2224/13024; H01L 2224/13124; H01L 2224/16145; H01L 2224/81815; H01L 2224/81191; H01L 2224/13111; H01L 2224/13005; H01L 2224/13016; H01L 2224/13184; H01L 2224/119; H01L 2224/05684; H01L 2224/05624; H01L 2224/05548; H01L 2224/13007; H01L 2224/11849; H01L 2224/13139; H01L 2224/13022; H01L 24/81; H01L 2224/05681; H01L 2224/05644; H01L 2224/133; H01L 2224/1191; H01L 2224/0345; H01L 2224/05647; H01L 2224/1181; H01L 2224/16227; H01L 2224/05567; H01L 2224/1329; H01L 24/16; H01L 23/3114; H01L 23/3157; H01R 43/0235
USPC .......................................................... 257/690
See application file for complete search history.

(56) References Cited

U.S. PATENT DOCUMENTS 5,072,520 A 12/1991 Nelson
5,869,904 A 2/1999 Shoji
(Continued)

FOREIGN PATENT DOCUMENTS

DE 102005040213 A1 3/2006
DE 112005001949 T5 5/2007
(Continued)

*Primary Examiner* — Ermias Woldegeorgis
(74) *Attorney, Agent, or Firm* — Slater & Matsil, L.L.P.

(57) ABSTRACT

Presented herein are an interconnect and method for forming the same, the method comprising forming an interconnect on a mounting surface of a mounting pad disposed on a first surface of a first substrate, the interconnect comprising a conductive material, optionally solder or metal, the interconnect avoiding the sides of the mounting pad. A molding compound is applied to the first surface of the first substrate and molded around the interconnect to covering at least a lower portion of the interconnect and a second substrate may be mounted on the interconnect. The interconnect may comprise an interconnect material disposed between a first and second substrate and a molding compound disposed on a surface of the first substrate, and exposing a portion of the interconnect. A sidewall of the interconnect material contacts the mounting pad at an angle less than about 30 degrees from a plane perpendicular to the first substrate.

17 Claims, 4 Drawing Sheets

(51) Int. Cl.
*H01L 23/00* (2006.01)
*H01L 23/31* (2006.01)

(52) U.S. Cl.
CPC ......... *H01L23/3114* (2013.01); *H01L 23/3157* (2013.01); *H01L 24/16* (2013.01); *H01L 24/81* (2013.01); *H01L 2224/0345* (2013.01); *H01L 2224/0401* (2013.01); *H01L 2224/05548* (2013.01); *H01L 2224/05567* (2013.01); *H01L 2224/05624* (2013.01); *H01L 2224/05644* (2013.01); *H01L 2224/05647* (2013.01); *H01L 2224/05681* (2013.01); *H01L 2224/05684* (2013.01); *H01L 2224/119* (2013.01); *H01L 2224/1181* (2013.01); *H01L 2224/1191* (2013.01); *H01L 2224/11334* (2013.01); *H01L 2224/11849* (2013.01); *H01L 2224/131* (2013.01); *H01L 2224/133* (2013.01); *H01L 2224/13005* (2013.01); *H01L 2224/13007* (2013.01); *H01L 2224/13016* (2013.01); *H01L 2224/13022* (2013.01); *H01L 2224/13024* (2013.01); *H01L 2224/1329* (2013.01); *H01L 2224/13111* (2013.01); *H01L 2224/13124* (2013.01); *H01L 2224/13139* (2013.01); *H01L 2224/13144* (2013.01); *H01L 2224/13184* (2013.01); *H01L 2224/16145* (2013.01); *H01L 2224/16225* (2013.01); *H01L 2224/16227* (2013.01); *H01L 2224/81024* (2013.01); *H01L 2224/81191* (2013.01); *H01L 2224/81815* (2013.01); *H01L 2924/181* (2013.01); *H01L 2924/18161* (2013.01)

(56) References Cited

U.S. PATENT DOCUMENTS

| | | | |
|---|---|---|---|
| 6,037,065 | A | 3/2000 | Hajmrle et al. |
| 6,158,644 | A | 12/2000 | Brofman et al. |
| 6,187,615 | B1 | 2/2001 | Kim et al. |
| 6,369,451 | B2 | 4/2002 | Lin |
| 6,425,516 | B1 | 7/2002 | Iwatsu et al. |
| 6,586,322 | B1 | 7/2003 | Chiu et al. |
| 6,643,923 | B1 | 11/2003 | Hishinuma et al. |
| 6,664,637 | B2 | 12/2003 | Jimarez et al. |
| 6,933,613 | B2 | 8/2005 | Akashi |
| 6,940,169 | B2 | 9/2005 | Jin et al. |
| 7,187,068 | B2 | 3/2007 | Suh et al. |
| 7,372,151 | B1 * | 5/2008 | Fan et al. ............ 257/738 |
| 7,749,882 | B2 | 7/2010 | Kweon et al. |
| 7,977,783 | B1 | 7/2011 | Park et al. |
| 8,264,089 | B2 | 9/2012 | Alvarado et al. |
| 8,362,612 | B1 * | 1/2013 | Paek et al. ............ 257/737 |
| 8,624,392 | B2 | 1/2014 | Yew et al. |
| 8,735,273 | B2 | 5/2014 | Lu et al. |
| 2001/0050434 | A1 | 12/2001 | Kaneda et al. |
| 2002/0001937 | A1 | 1/2002 | Kikuchi et al. |
| 2003/0068847 | A1 | 4/2003 | Watanabe et al. |
| 2003/0096453 | A1 * | 5/2003 | Wang et al. ............ 438/108 |
| 2004/0012930 | A1 | 1/2004 | Grigg |
| 2004/0027788 | A1 | 2/2004 | Chiu et al. |
| 2004/0072387 | A1 | 4/2004 | Hong et al. |
| 2004/0266162 | A1 | 12/2004 | Feng |
| 2005/0080956 | A1 | 4/2005 | Zaudtke et al. |
| 2006/0038291 | A1 | 2/2006 | Chung et al. |
| 2006/0063378 | A1 | 3/2006 | Lin et al. |
| 2007/0045840 | A1 | 3/2007 | Varnau |
| 2007/0102815 | A1 | 5/2007 | Kaufmann et al. |
| 2007/0108573 | A1 | 5/2007 | Chung et al. |
| 2007/0176290 | A1 | 8/2007 | Park et al. |
| 2007/0184577 | A1 | 8/2007 | Chung et al. |
| 2007/0187825 | A1 | 8/2007 | Hashimoto |
| 2007/0267745 | A1 | 11/2007 | Chao et al. |
| 2008/0001290 | A1 | 1/2008 | Chou et al. |
| 2008/0308935 | A1 * | 12/2008 | Kim et al. ............ 257/738 |
| 2009/0045513 | A1 | 2/2009 | Kim et al. |
| 2009/0052218 | A1 | 2/2009 | Kang |
| 2009/0130840 | A1 | 5/2009 | Wang et al. |
| 2009/0140442 | A1 | 6/2009 | Lin |
| 2009/0140942 | A1 | 6/2009 | Mikkola et al. |
| 2009/0206479 | A1 | 8/2009 | Daubenspeck et al. |
| 2009/0314519 | A1 | 12/2009 | Soto et al. |
| 2010/0065966 | A1 | 3/2010 | Pendse et al. |
| 2010/0078772 | A1 | 4/2010 | Robinson |
| 2010/0096754 | A1 | 4/2010 | Lee et al. |
| 2010/0140760 | A1 | 6/2010 | Tam et al. |
| 2011/0101520 | A1 | 5/2011 | Liu et al. |
| 2011/0278739 | A1 | 11/2011 | Lai et al. |
| 2012/0006592 | A1 | 1/2012 | Ouchi et al. |
| 2012/0199959 | A1 | 8/2012 | Hart et al. |
| 2012/0199991 | A1 | 8/2012 | Okamoto et al. |
| 2012/0261817 | A1 | 10/2012 | Do et al. |
| 2013/0009307 | A1 | 1/2013 | Lu et al. |
| 2013/0105971 | A1 | 5/2013 | Daubenspeck et al. |
| 2013/0147031 | A1 | 6/2013 | Chen et al. |
| 2013/0168850 | A1 | 7/2013 | Samoilov et al. |
| 2013/0181338 | A1 | 7/2013 | Lu et al. |
| 2014/0054764 | A1 | 2/2014 | Lu et al. |
| 2014/0077361 | A1 | 3/2014 | Lin et al. |
| 2014/0159223 | A1 | 6/2014 | Chen et al. |
| 2014/0232017 | A1 | 8/2014 | Rampley et al. |
| 2015/0123269 | A1 | 5/2015 | Chen et al. |
| 2015/0137352 | A1 | 5/2015 | Chen et al. |
| 2015/0235977 | A1 | 8/2015 | Shao et al. |
| 2015/0243613 | A1 | 8/2015 | Chen et al. |
| 2015/0262948 | A1 | 9/2015 | Lu et al. |

FOREIGN PATENT DOCUMENTS

| | | |
|---|---|---|
| KR | 1020070076846 | 7/2007 |
| KR | 20090018442 A | 2/2009 |
| KR | 20090120215 A | 11/2009 |
| KR | 20100131180 A | 12/2010 |

* cited by examiner

SYSTEM AND METHOD FOR AN IMPROVED FINE PITCH JOINT

REFERENCE TO RELATED APPLICATIONS

This application relates to the following co-pending and commonly assigned patent applications: Ser. No. 13/349,405, filed Jan. 12, 2012, entitled "Package on Package Interconnect Structure;" Ser. No. 13/838,748, filed Mar. 15, 2013, entitled "Interconnect Structures and Methods of Forming Same;" Ser. No. 13/868,554, filed Apr. 23, 2013, entitled "Apparatus and Method for Wafer Separation;" Ser. No. 13/913,599, filed Jun. 10, 2013, entitled "Interconnect Joint Protective Layer Apparatus and Method;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

CROSS-REFERENCE TO RELATED APPLICATIONS

This application claims the benefit of U.S. Provisional Application No. 61/746,687, filed on Dec. 28, 2012, entitled "System and Method for an Improved Fine Pitch Joint" which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Solder ball grid arrays are also a technique sometimes used to join substrate, dies or packages, with an array of solder balls deposited on the bonding pads of a first substrate, and with a second substrate, die or package joined at its own bonding pad sites to the first pad via the solder balls. Solder balls may be formed on a pad as liquid solder, and then solidified for additional processing. The environment with the solder balls is subsequently heated to melt the solder balls and the packages compressed to cause the solder balls to contact the upper land lower pads.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive wafer level chip scale package (WLCSP) interconnect or joint (an "interconnect"), and do not limit the scope of the disclosure.

Embodiments will be described with respect to a specific context, namely making and using interconnects useful in, for example, WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 9, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
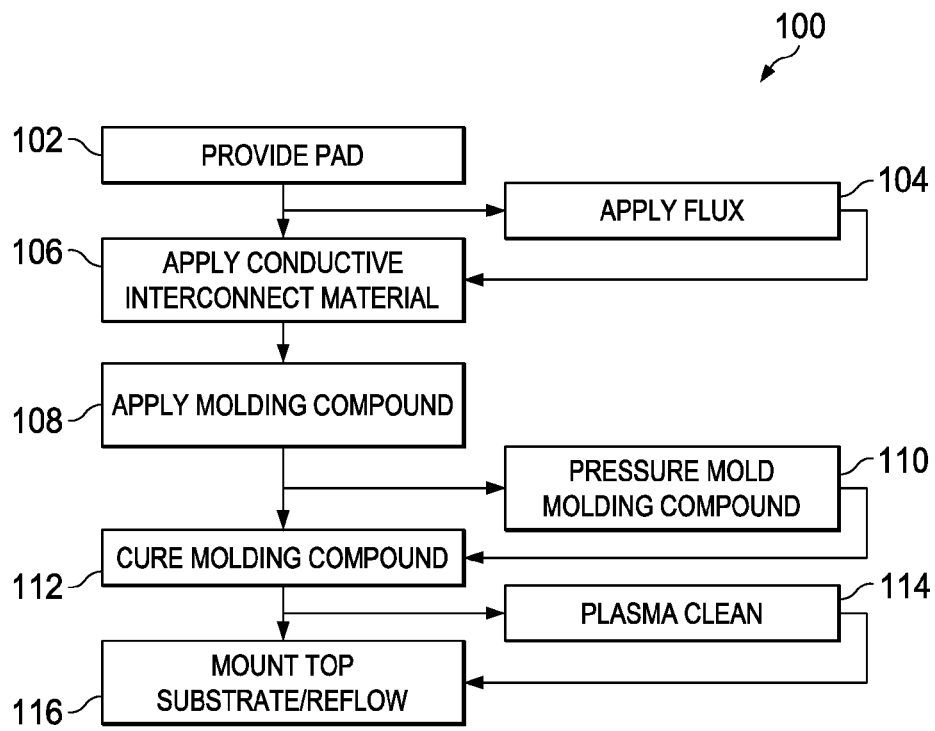
FIG. 1 shows a flow diagram illustrating a method for forming a wafer level chip scale package (WLCSP) interconnect according to an embodiment.
Figure 2:
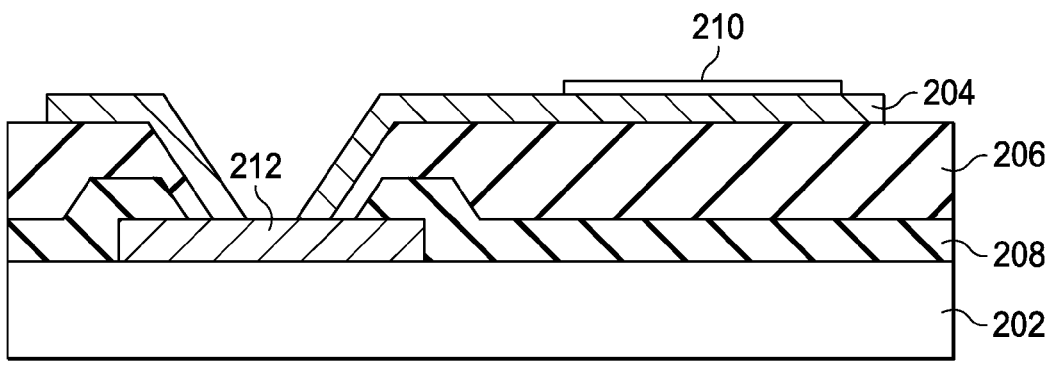
FIGS. 2 through 7 illustrate cross-sectional views of intermediate steps in forming an embodiment of interconnects according to an embodiment.

FIG. 1 shows a flow diagram illustrating a method 100 for forming an interconnect according to an embodiment. The method 100 of FIG. 1 will be described in the context of FIGS. 2-7 for illustrative purposes. As illustrated in FIG. 2, the mounting pad 204 may be disposed over a substrate 202 such as a wafer, chip, die, package or other carrier. While one substrate 202 is shown in the drawings, several die substrates 202 may optionally be processed on a workpiece, and the workpiece may be singulated during a subsequent process step. The substrate 202 may have one or more finishing layers such as a passivation layer 208 or a polyimide layer 206 disposed thereon. Additionally, while not shown, the substrate 202 may also have one or more interlayer dielectric layers, intermetal layers, insulator layers, redistribution layers or any other suitable substrate processing layer. The mounting pad 204 may be electrically connected to a trace 212, through via, land, or the like, and may be disposed on, or formed as part of, a post-passivation interconnect, metal layer, or the like. In one embodiment, the mounting pad 204 may be copper (Cu), but may in other embodiments, be polysilicon, gold (Au), aluminum (Al), tantalum (Ta), tungsten (W), or any other suitable conductive material or compound. A copper mounting pad 204 may be formed using photolithography and deposition processes such as plasma enhanced chemical vapor deposition (PECVD), physical vapor deposition (PVD), sputtering, or another deposition process.

Figure 3:
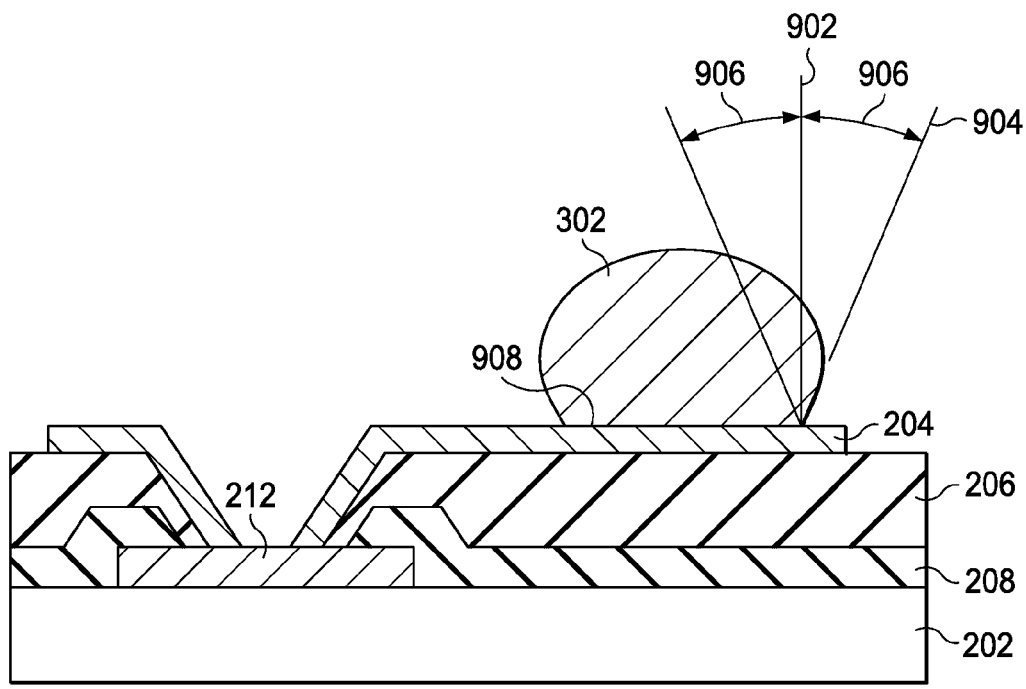

Referring to block 104 of FIG. 1, flux 210 may be applied to the mounting pad 204, as shown in FIG. 2. Referring further to block 106 of FIG. 1, a conductive interconnect material 302 may be applied as shown in FIG. 3. In an embodiment, the interconnect material 302 may be a metal such as solder, but may also be another metal, such as gold (Au), aluminum (Al), lead (Pb), silver (Ag), tungsten (W), Tin (Sn), or another metal or alloy. In another embodiment, the interconnect material 302 may be a conductive material such as a conductive epoxy or polymer.

The shape of an interconnect material 302 structure may be controlled to prevent slumping, or widening of the interconnect material 302 during processing. For example, in an embodiment, the interconnect material 302 may be metal, the metal may be deposited or applied, and then reflowed in a later step when a second substrate such as a top package is applied. Reflowing the metal may cause the metal to settle, or slump in a softened or liquid state. Such slumping may cause the metal to widen. In a fine pitch arrangement, even a small widening of metal balls may cause bridging between adjacent metal balls, shorting out the bridged conductive joints. In other embodiments, the interconnect material 302 may be solder paste, a conductive adhesive, or the like. Thus, controlling the shape of an interconnect material 302 structure may permit a finer pitch, or a smaller spacing between adjacent interconnects, without bridging.

In one embodiment, the spread of an interconnect material 302 may be controlled by controlling the structure of the interconnect material 302 on the mounting pad 204, as well as by applying a material to prevent spread of the interconnect material 302. For example, when the interconnect material 302 is solder, flux 210 may be applied to the mounting pad 204 to control the spread of solder on the mounting pad 204 surface. The flux 210 tends to cause the interconnect material 302 to remain within the region where the flux 210 was applied. The flux 210 also tends to pre-wet the mounting pad 204 and cause the interconnect material 302 to remain within the flux area due to surface tension of the interconnect material 302. In an embodiment, the interconnect material 302 may be applied so that the interconnect material 302 avoids wetting the side of the mounting pad 204. In such an embodiment, the interconnect material 302 may be placed that it is separated from the edge of the mounting pad 204, or such that it is at the edge of the mounting pad 204, but avoids flowing over the mounting pad 204 edge. The interconnect material 302 positioning may be controlled, for example, by applying flux 210 in a position separate or spaced from the edge of the mounting pad 204. Therefore, the area in which the flux 210 was applied may be determined so that a interconnect material 302 may be applied with a predetermined height and width.

In an embodiment, an interconnect material 302 may be applied in a convection heating environment. In another embodiment, the metal is applied in a conductive heating environment, wherein the interconnect material 302 is heated through indirect or direct contact with a heating element. For example, conductive heating of a wafer may cause the mounting pad 204 to conduct heat to the interconnect material 302 as it is applied. This conductive heating environment may cause the interconnect material 302 to melt from the bottom, where the interconnect material 302 initially contacts the mounting pad 204, which may cause the interconnect material 302 to slump before fully melting. In contrast, a convection heating system tends to heat the interconnect material 302 structure from the outside inwards, typically from all directions at the same time, since the heat is applied through the atmosphere. In such a convection heating environment, interconnect material 302 tends to retain its shape, preventing slumping.

In some embodiments, the interconnect material 302 may have a sidewall angle 906 controlled relative to the mounting pad 204. In an embodiment, the sidewall of the interconnect material 302 structure contacts the mounting pad 204 at an angle 906 of less than about 30 degrees between a tangent 904 of the interconnect material 302 sidewall and a line perpendicular 902 to the mounting pad 204 or the substrate 202. In another embodiment, the sidewall of the interconnect material 302 structure contacts the mounting pad 204 at an angle 906 of less than about 20 degrees between a tangent 904 of the interconnect material 302 sidewall and a line perpendicular 902 to the mounting pad 204 or the substrate 202. An angle 906 less than about 20 degrees may cause less slumping when, for example, a metal interconnect material 302 is reflowed.

Figure 4:
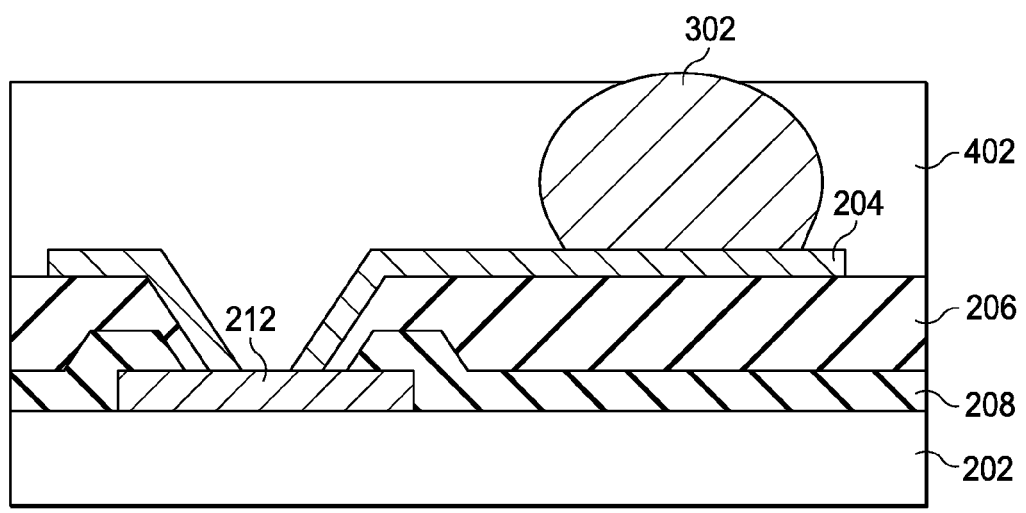

Referring to block 108 of FIG. 1, a molding compound 402 may be applied as shown in FIG. 4. In one embodiment, the molding compound 402 may be a nonconductive material, such as an epoxy, a resin, a moldable polymer, or the like. The molding compound may be formed to provide lateral support to the interconnect material 302 during reflow.

Figure 5:
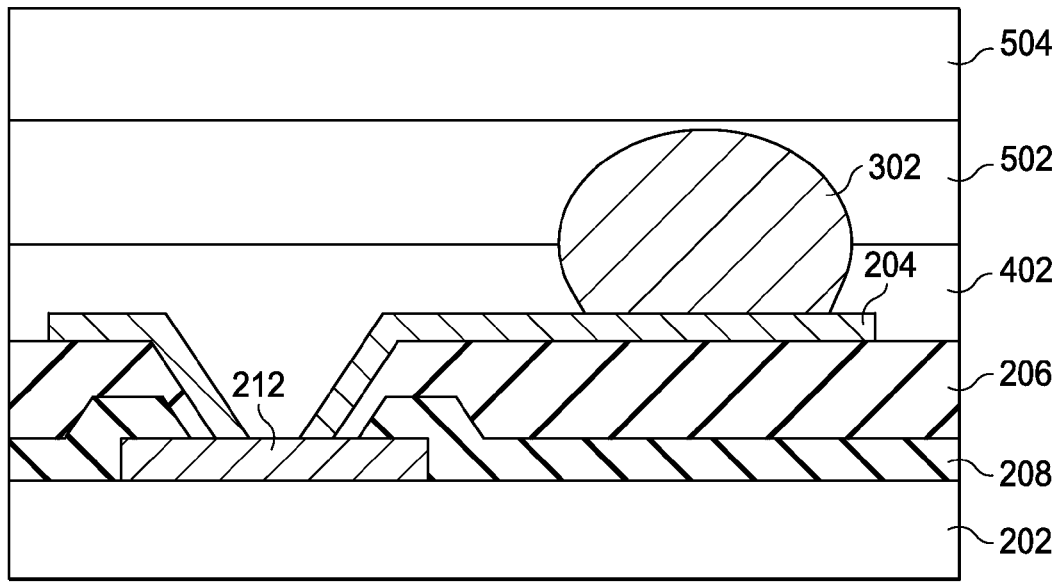

Referring to block 110 of FIG. 1, the molding compound 402 may be shaped or molded using for example, a mold 504 as shown in FIG. 5. A release compound 502 may be optionally applied to the mold 504 to prevent the molding compound 402 from adhering to the mold 504. The mold 504 may have a border or other feature for retaining molding compound 402 when applied.

The molding compound 402 may be molded around the interconnect material 302 so that a portion of the interconnect material 302 is exposed for mounting of other structures in subsequent steps.

In an embodiment, the mold 504 may be configured to accept one or more interconnect material 302 structures by way of recesses formed in the mold 504. The molding compound 402 may also be formed by the mold 504 using a layer of release compound 502 thick enough to compress the molding compound 402 while still separating the mold 504 from the interconnect material 302. In an embodiment, the mold 504 may be used to pressure mold the molding compound 402 to force the molding compound into openings and recesses, and may avoid air pockets or the like in the molding compound 402.

Figure 6:
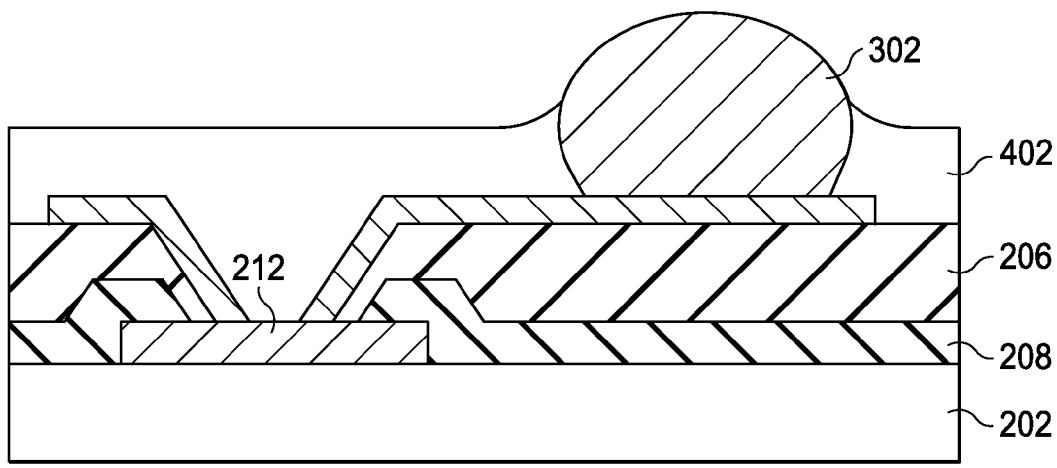

Referring to block 112 of FIG. 1, the molding compound 402 may be cured, and the mold 504, and release compound 502 if applicable, removed as shown in FIG. 6. The molding compound 402 may be applied while substantially liquid, and then may be cured through a chemical reaction, such as in an epoxy or resin. In another embodiment the molding compound 402 may be an ultraviolet (UV) cured polymer applied as a gel or malleable solid capable of being disposed on the substrate 202 and around or conforming to the interconnect material 302 structure surface. The optional application of the release compound 502 in block 110 of FIG. 1 may permit parting of the mold 504 from the molding compound 402, and may be used in an embodiment where the molding compound 402 is an epoxy or resin to prevent the molding compound 402 material from adhering to the mold 504 surface.

In an embodiment, the molding compound 402 may be molded over a lower portion of the interconnect material 302 and so that a portion of the molding compound 402 reaches at least about half of the height of the interconnect material 302. In an embodiment, the molding compound 402 may have a final molded height of about 100 µm. An upper portion of the interconnect material 302 may be exposed through the molding compound 402. In an embodiment, the molding compound 402 may be formed to support the interconnect material 302 in later processing steps. The molding compound 402 is contoured to the body of the solidified interconnect material 302 during application, molding and curing the molding compound of blocks 108, 110 and 112 of FIG. 1. The molding compound 402 retains this shape during reflow. For example, where the interconnect material 302 is metal, the interconnect material 302 may be reflowed for attaching a second substrate. In such an example, the molding compound 402 may confine the metal and prevent bridging between adjacent metal balls during the reflow process.

Figure 7:
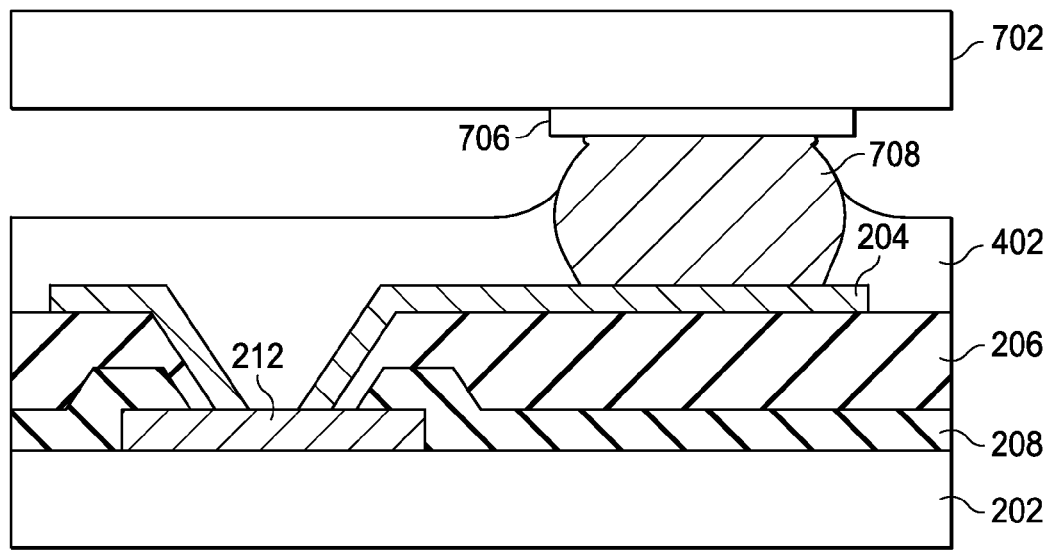

With reference to block 114 of FIG. 1, a plasma cleaning process may optionally be applied to the interconnect material 302. In an embodiment, the plasma clean process may clean the interconnect material and remove any residual release compound 502 or molding compound 402. Referring to block 116 of FIG. 1, a second substrate 702 may be mounted and the interconnect material activated to attach to the second substrate 702, as shown in FIG. 7, thereby forming an electrical connection between the first substrate 202 and the second substrate 702. An interconnect 708 is formed from the interconnect material 302. In one embodiment, the second substrate 702 may have lands 706, which may be joined to the interconnect material 302. The second substrate 702 may be a die, wafer, interposer, or another electrical component.

Figure 8:
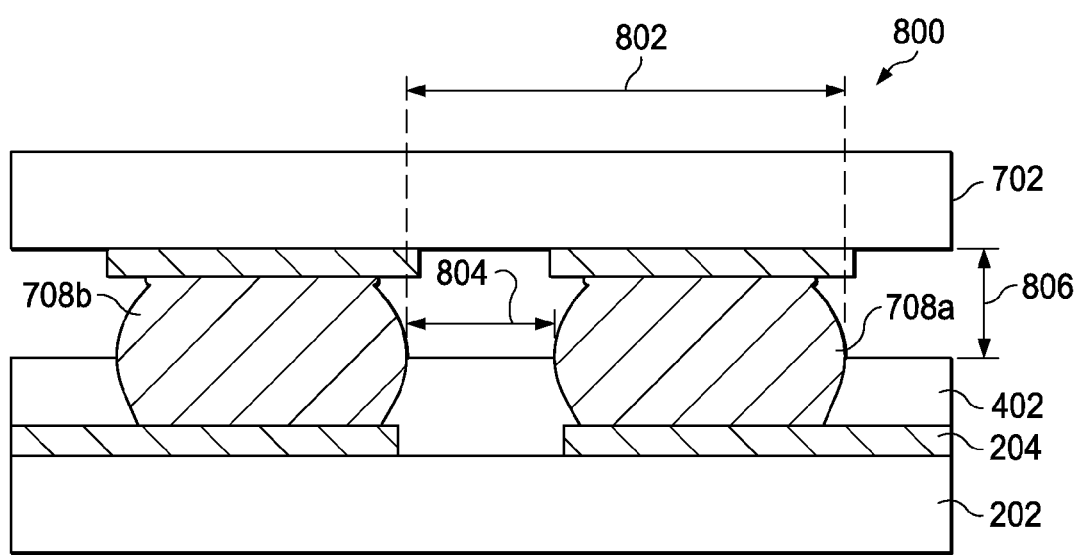
FIG. 8 illustrates a cross-sectional view of multiple interconnects in relation to one other.

FIG. 8 illustrates a cross-sectional view of multiple interconnects 708a, 708b in relation to one other. In an embodiment, a first interconnect 708a may have a pitch 802 relative to a second interconnect 708b of between about 300 µm and about 400 µm. In an embodiment, the interconnect material 302 may be applied in a volume calculated or predetermined to result in a metal ball of about 250 µm in diameter, which may result in a height and width after reflow of about 240 µm. In another embodiment, the interconnect material 302 may be applied as a metal ball of about 280 µm in diameter which may result in a height and width of about 260 µm after reflow. In another embodiment, the interconnect may have a height and a width that are about equal, and the height and width may each may be between about 240 µm and about 260 µm.

The interconnect 708 pitch may be configured to account for the size of the interconnects, and may result in a spacing 804 between about 40 µm and about 150 µm. Additionally, the molding compound 402 may be molded to a height of at least about half the height of the interconnects 702a and 702b, leaving a separation 806 between the molding compound 402 and the second substrate 702 of about 140 µm or less.

In an embodiment, a method of forming an interconnect, may comprise forming an interconnect on a mounting surface of a mounting pad disposed on a first surface of a first substrate, the interconnect comprising a conductive material. The method may further comprise forming a molding compound around the interconnect, with the molding compound covering at least a lower portion of the interconnect, and at least a portion of the interconnect being exposed. Forming the molding compound may comprise using a mold to form the molding compound around the interconnect. Forming the interconnect may optionally comprise applying a metal ball to the mounting pad, and heating the metal in a convection environment. The metal ball may be applied with a sidewall of the metal ball contacting the mounting pad at an angle less than about 20 degrees from a plane perpendicular to the mounting surface of the mounting pad.

A second substrate may be mounted on the interconnect by activating the interconnect, a land of the second substrate disposed on the interconnect, and activating the interconnect may comprise reflowing the metal. Reflowing the metal may further optionally comprise forming the interconnect with a height of the interconnect about equal to a width of the interconnect.

An embodiment of a method of forming an interconnect may comprise applying a flux on a mounting surface of a mounting pad disposed on a first surface of a first substrate, applying a metal interconnect material on a mounting surface and on the flux, applying a molding compound to the first surface of the first substrate, and forming the molding compound around the interconnect, the molding compound exposing an upper portion of interconnect material. The method may comprise applying the interconnect material with a sidewall of the interconnect material contacting the mounting pad at an angle less than about 30 degrees, or optionally, at an angle less than about 20 degrees, from a plane perpendicular to the mounting surface of the mounting pad. The method of claim 10, wherein forming the interconnect further comprises applying the interconnect material with a sidewall of the interconnect material contacting the mounting pad at an angle less than about 20 degrees from a plane perpendicular to the mounting surface of the mounting pad. Forming the molding compound may comprise using a mold to form the molding compound around the interconnect, the mold having a release compound disposed therein, the release compound in contact with the molding compound during the molding the molding compound. A plasma cleaning of the interconnect material may be performed after molding the molding compound.

An embodiment of an interconnect joint may comprise a conductive interconnect material disposed on a mounting pad of a first substrate, the interconnect material connected to a land on a second substrate, the interconnect material in contact with a mounting surface of the mounting pad, and a molding compound disposed on a surface of the first substrate, covering a portion of the interconnect material and exposing a portion of the interconnect material. The interconnect material optionally has a height between about 240 µm and about 260 µm and a width between about 240 µm and about 260 µm, and in the interconnect material may have a height about equal to a width.

The interconnect joint may further comprise a sidewall of the interconnect material contacting the mounting pad at an angle less than about 30 degrees, or optionally, at an angle less than about 20 degrees, from a line perpendicular to the mounting surface of the mounting pad. The interconnect material may also contact the mounting pad at a point separate from an edge of the mounting pad. The molding compound may cover the interconnect material to a distance of about half a height of the interconnect material.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming an interconnect, comprising:
   forming an interconnect on a mounting surface of a mounting pad disposed on a first surface of a first substrate, the forming the interconnect further comprising:
      applying a flux on the mounting surface of the mounting pad;
      applying a metal ball to the flux, the metal ball having a first height and a first width; and
      heating the metal ball in a convection environment;
   forming a molding compound around the interconnect, the molding compound covering at least a lower portion of the interconnect, at least a portion of the interconnect being exposed, wherein before the forming the molding compound, the metal ball has the first height and the first width, and wherein after the forming the molding compound, the metal ball has the first height and the first width; and
   reflowing the interconnect, wherein after the reflowing, the metal ball of the interconnect has the first height and the first width, the first height being about equal to the first width, wherein the flux, the convection heating environment, and the molding compound are utilized to control the first height and the first width of the metal ball of the interconnect.

2. The method of claim 1, wherein forming the interconnect further comprises applying the metal ball with a sidewall of the metal ball contacting the mounting pad at an angle less than about 20 degrees from a plane perpendicular to the mounting surface of the mounting pad.

3. The method of claim 1, further comprising mounting a second substrate on the interconnect by activating the interconnect, a land of the second substrate disposed on the interconnect.

4. The method of claim 3, wherein activating the interconnect comprises reflowing the metal ball.

5. The method of claim 1, wherein forming the molding compound comprises using a mold to form the molding compound around the interconnect.

6. A method of forming an interconnect, comprising:
   applying a flux on a mounting surface of a mounting pad disposed on a first surface of a first substrate;
   applying a metal ball on the flux;
   heating the metal ball in a convection environment;
   forming a molding compound around the interconnect, the molding compound exposing an upper portion of the metal ball, wherein before the forming the molding compound, the metal ball has a first height and a first width, and wherein after the forming the molding compound, the metal ball has the first height and the first width; and
   reflowing the metal ball, wherein after the reflowing, the metal ball has the first height and the first width, the first height being about equal to the first width, wherein the flux, the convection heating environment, and the molding compound are utilized to control the first height and the first width of the metal ball.

7. The method of claim 6, wherein forming the interconnect further comprises applying the metal ball with a sidewall of the metal ball contacting the mounting pad at an angle less than about 30 degrees from a plane perpendicular to the mounting surface of the mounting pad.

8. The method of claim 7, wherein forming the interconnect further comprises applying the metal ball with a sidewall of the metal ball contacting the mounting pad at an angle less than about 20 degrees from the plane perpendicular to the mounting surface of the mounting pad.

9. The method of claim 6, wherein forming the molding compound comprises using a mold to form the molding compound around the interconnect, the mold having a release compound disposed therein, the release compound in contact with the molding compound during forming the molding compound.

10. The method of claim 9, further comprising plasma cleaning the metal ball after forming the molding compound.

11. A method comprising:
    forming a mounting pad over a first substrate;
    forming a conductive interconnect on a mounting surface of the mounting pad, a sidewall of the conductive interconnect contacting the mounting pad at a sidewall angle, the sidewall angle being less than about 20 degrees from a plane perpendicular to the mounting surface of the mounting pad, the forming the conductive interconnect further comprises:
       applying a flux on the mounting surface of the mounting pad;
       applying a metal ball to the flux; and
       heating the metal ball in a convection environment to form the conductive interconnect;
    forming a molding compound around the conductive interconnect, the molding compound covering at least a lower portion of the conductive interconnect, at least a portion of the conductive interconnect being exposed through the molding compound, wherein the flux, the convection heating environment, and the molding compound are utilized to control the sidewall angle of the conductive interconnect; and
    bonding a second substrate to the conductive interconnect, the second substrate being separated from a top surface of the molding compound by a first distance measured in a direction perpendicular to a major surface of the second substrate.

12. The method of claim 11, wherein the top surface of the molding compound adjoining and surrounding the conductive interconnect is a concave top surface.

13. The method of claim 11, wherein the first distance is less than or equal to about 140 µm.

14. The method of claim 11, wherein the molding compound contacts the mounting surface and sidewalls of the mounting pad.

15. The method of claim 11 further comprising:
    forming a conductive trace over the first substrate;
    forming a passivation layer over the first substrate and partially over a top surface of the conductive trace; and
    forming a polymer layer over the passivation layer, the polymer layer contacting the top surface of the conductive trace, the mounting pad extending through the polymer layer to contact the conductive trace.

16. The method of claim 11, wherein a height of the metal ball is between about 240 µm and about 260 µm and a width of the metal ball is between about 240 µm and about 260 µm.

17. The method of claim 11, wherein the metal ball has a height about equal to a width of the metal ball.

* * * * *